United States Patent
Fujishiro et al.

(10) Patent No.: US 6,495,298 B1
(45) Date of Patent: Dec. 17, 2002

(54) PHOTOPOLYMERIZABLE RESIN COMPOSITIONS AND USE THEREOF

(75) Inventors: Koichi Fujishiro, Kisaradu (JP); Manabu Higashi, Kisaradu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/701,495

(22) PCT Filed: Jun. 8, 1999

(86) PCT No.: PCT/JP99/03060

§ 371 (c)(1),
(2), (4) Date: Nov. 29, 2000

(87) PCT Pub. No.: WO99/64471

PCT Pub. Date: Dec. 16, 1999

(30) Foreign Application Priority Data

Jun. 8, 1998 (JP) ............................. 10-159593

(51) Int. Cl.[7] .............................. C08F 2/48; C09D 4/00; G03F 7/028; G02B 5/20
(52) U.S. Cl. ..................... 430/7; 430/281.1; 430/288.1; 522/8; 522/9; 522/13; 522/16; 522/18; 106/31.13
(58) Field of Search ....................... 430/7, 281.1, 288.1; 522/8, 9, 13, 16, 18; 106/31.13, 31.27, 31.6

(56) References Cited

FOREIGN PATENT DOCUMENTS

| JP | 54074887 A | 6/1979 |
|---|---|---|
| JP | 61123602 A | 6/1986 |
| JP | A61173242 | 8/1986 |
| JP | A6224240 | 2/1987 |
| JP | A4173804 | 6/1992 |
| JP | 06001938 A | 1/1994 |
| JP | A627662 | 2/1994 |
| JP | 06167808 A | 6/1994 |
| JP | A7126312 | 5/1995 |
| JP | 7-300381 A | * 11/1995 |
| JP | A10110008 | 4/1998 |

* cited by examiner

Primary Examiner—John A. McPherson
(74) Attorney, Agent, or Firm—Birch, Stewart, Kolasch & Birch, LLP

(57) ABSTRACT

This invention relates to a photopolymerizable resin composition containing resin component (A) composed of a resin and/or a resin-forming ingredient and a photopolymerization initiator (B) wherein the component (A) comprises an addition-polymerizable compound (A1) having at least two ethylenically unsaturated groups and the photopolymerization initiator (B) comprises a diaminobenzophenone compound (B1), an N-phenylglycine compound (B2), and at least one kind of compound selected from a group of a 3,3',4,4'-tetra(alkylperoxycarbonyl)benzophenone (B3), 2-methyl-1-[4-(thiomethyl)phenyl]- 2-morpholinopropan-1-one (B4), and a 1,3,5-triazine derivative (B5) containing at least one trihalomethyl group as substituent. A photopolymerizable resin composition of this invention excels in resolution, adhesion of patterns, development latitude, and curing on the surface and inside and can be used advantageously in insulating films, colored films, inks for color filters, resists for semiconductors, and insulating spacers for touch panels.

9 Claims, 1 Drawing Sheet

40 μm  40 μm  40 μm

40 μm  40 μm  40 μm

PHOTOPOLYMERIZABLE RESIN COMPOSITIONS AND USE THEREOF

This application is the national phase under 35 U.S.C. § 371 of PCT International Application No. PCT/JP99/03060 which has an International filing date of Jun. 8, 1999, which designated the United States of America.

FIELD OF TECHNOLOGY

This invention relates to photopolymerizable resin compositions which are useful for applications such as insulating films for semiconductors, resists for semiconductors, protective films for color filters, colored films, and insulating spacers for touch panels.

BACKGROUND TECHNOLOGY

Photopolymerizable resin compositions are exposed to light, generally with the use of UV as light source, in their applications to letterpress, relief images, photoresists, and the like and the resin compositions of this type contain a resin component which constitutes the main body of an image to be formed and a photopolymerization initiator which, upon exposure to light such as UV, generates an active species for polymerization.

From the standpoint of environmental problems and ease of obtaining a large difference in solubility before and after exposure to light in recent years, there is a preference for an aqueous solution of alkali to an organic solvent in the development step in the application of photopolymerizable resin compositions. In such a case, a combination of an addition-polymerizable compound containing an ethylenically unsaturated group and a resin soluble in an aqueous solution of alkali is used preferentially for the resin component which constitutes the main body of an image. There is a demand for higher sensitivity for this type of photopolymerizable resin compositions and numerous studies are in progress on photopolymerization initiators in order to enhance the sensitivity.

Many substances are known already for photopolymerization initiators; for example, benzoin and its derivatives and substituted and unsubstituted quinones [Photopolymer Handbook, Chapter 6, edited by Photopolymer Konwakai (in Japanese)]. These compounds, however, are not sufficiently sensitive to the i-line (365 nm), h-line (405 nm) and g-line (437 nm) mainly emitted by a commonly used mercury vapor lamp.

A combination of benzophenone, a diaminobenzophenone compound, and an N-phenylglycine compound has been proposed for use as a photopolymerization initiator in order to obtain photopolymerizable resin compositions with enhanced sensitivity in the range 300–450 nm [Japan Tokkyo Koho Hei 4-27541 (1992)].

However, when a photopolymerizable resin composition containing this combination of benzophenone, a diaminobenzophenone compound, and an N-phenylglycine compound is exposed to light whose main component is the i-line, the composition lacks sufficient sensitivity to undergo curing on the surface when the film thickness is less than 10 μm during exposure to light. On the other hand, when the film thickness exceeds 10 μm during exposure to light, the addition of the diaminobenzophenone compound is diminished in order to advance the photocuring in the inside until the adherence of a pattern during development is secured; then the generation of radicals from the photopolymerization initiator diminishes, which leads to the hindrance of the surface curing and roughening of the surface of the film after development.

Methods for incorporating a halomethyltriazine as photopolymerization initiator into colored photopolymerizable compositions for use in color filters are known [Japan Tokkyo Koho Sho 59-28328 (1984), Japan Tokkyo Koho Hei 5-88243 (1993), Japan Kokai Tokkyo Koho Hei 6-167808 (1994), and Japan Kokai Tokkyo Koho Hei 6-27662 (1994)].

The aforementioned photopolymerizable compositions containing a halomethyltriazine are colored yellow, although highly sensitive, and posed a problem of reducing the transmission of blue filters in particular and the compound in question was a cause of extensive discoloration during heating.

There is a demand for displays with high color purity and brightness for color liquid crystal displays in recent years. In the case of color filters with high color purity, light in the ultraviolet region reaches the deep part of the film with difficulty and this poses problems such as poor adhesion of a pattern due to insufficient curing in the deep part of the film and peeling off of a pattern during development. Moreover, absorption of the photopolymerization initiator and yellowing after heat treatment sometimes diminished the brightness of color filters.

Accordingly, an object of this invention is to provide a photopolymerizable resin composition which excels in resolution, development latitude and surface curability and shows enhanced sensitivity particularly to the i-line and, furthermore, to provide a photopolymerizable resin composition which is curable even at a film thickness of, say, 10 μm or more and, when used in a colored polymerizable composition, is highly transparent and does not significantly affect the color characteristics. Another object of this invention is to provide a photopolymerizable resin composition which is highly sensitive to UV, not only to the i-line but also to lines in the range to the g-line.

A further object of this invention is to provide a blue ink with excellent color characteristics. A still further object of this invention is to provide a film to be obtained by applying the aforementioned photopolymerizable resin composition or a blue ink followed by curing and to provide a color filter containing said film as blue filter or protective film.

DISCLOSURE OF THE INVENTION

Thus, this invention relates to a photopolymerizable resin composition comprising a resin and/or a resin-forming ingredient as component (A) and a photopolymerization initiator (B), wherein the component (A) comprises an addition-polymerizable compound (A1) which shows a boiling point of 100° C. or higher at normal pressure and has at least 2 ethylenically unsaturated groups in the molecule and the component (B) comprises a diaminobenzophenone compound (B1) represented by the following general formula (1)

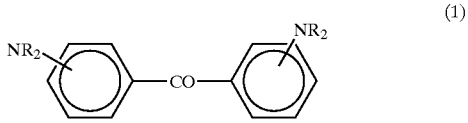

(in which R is a hydrogen atom or an alkyl group with 1–3 carbon atoms, either identical with or different from each other), an N-phenylglycine compound (B2) represented by the following general formula (2)

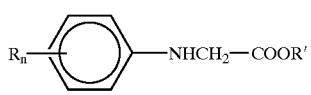

(in which R is an alkyl group with 1–8 carbon atoms, R' is a hydrogen atom or an alkyl group with 1–8 carbon atoms, n is an integer in the range 0–5, and R may be identical with or different from each other when n is 2 or more), and at least one kind of compound selected from a group of a 3,3',4,4'-tetra(alkylperoxycarbonyl)benzophenone (B3) represented by the following general formula (3)

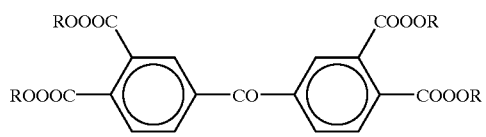

(in which R is an alkyl group with 1–8 carbon atoms, identical with or different from each other), 2-methyl-1-[4-(methylthio)phenyl]-2-morpholinopropan-1-one (B4), and a 1,3,5-triazine derivative (B5) containing at least one trihalomethyl group as substituent.

This invention also relates to the aforementioned photopolymerizable resin composition wherein the component (A) composed of a resin and/or a resin-forming ingredient comprises the addition-polymerizable compound (A1) and an alkali-soluble resin (A2) and the ratio (A1)/(A2) by weight is 10/90–90/10.

This invention further relates to the aforementioned photopolymerizable resin composition which comprises 100 parts by weight of the component (A), 0.05–2.0 parts by weight of a diaminobenzophenone compound (B1), 0.2–2 parts by weight of an N-phenylglycine compound (B2), 0–2.5 parts by weight of a 3,3',4,4'-tetra (alkylperoxycarbonyl)benzophenone (B3), 0–5 parts by weight of 2-methyl-1-[4-(methylthio)phenyl]-2-morpholinopropan-1-one (B4), and 0–1 part by weight of a 1,3,5-triazine derivative (B5). Likewise, this invention relates to the aforementioned photopolymerizable resin composition which comprises 100 parts by weight of the component (A), 0.05–2.0 parts by weight of a diaminobenzophenone compound (B1), 0.2–2 parts by weight of an N-phenylglycine compound (B2), 0.1–2.5 parts by weight of a 3,3',4,4'-tetra(alkylperoxycarbonyl)benzophenone (B3), 1–5 parts by weight of 2-methyl-1-[4-(methylthio)phenyl]-2-morpholinopropan-1-one (B4), and 0–0.5 part by weight of a 1,3,5-triazine derivative (B5). Still more, this invention relates to the aforementioned photopolymerizable resin composition wherein the component (A) comprises the addition-polymerizable compound (A1) and the alkali-soluble resin (A2) at the ratio (A1)/(A2) by weight of 10/90–90/10 and the composition comprises 100 parts by weight of the sum of (A1) and (A2), 0.05–2.0 parts by weight of a diaminobenzophenone compound (B1), 0.2–2 parts by weight of an N-phenylglycine compound (B2), 0–2.5 parts by weight of a 3,3',4,4'-tetra (alkylperoxycarbonyl)benzophenone (B3), 1–5 parts by weight of 2-methyl-1-[4-(methylthio)phenyl]-2-morpholinopropan-1-one (B4), and 0–0.5 part by weight of a 1,3,5-triazine derivative (B5).

In addition, this invention relates to the aforementioned photopolymerizable resin composition into which a blue colorant is incorporated and to a blue ink. This invention relates to a film obtained by applying the photopolymerizable resin composition or blue ink followed by curing. This invention also relates to a color filter containing the aforementioned film.

A photopolymerizable resin composition of this invention contains the component (A) composed of a resin and/or a resin-forming ingredient and the photopolymerization initiator (B) as essential ingredients. As the component A comprises a resin and/or a resin-forming ingredient, that is, a resin and/or a compound polymerizable into resin, the component A as a whole is bound to exist as resin after polymerization. For this reason, the component A will be hereinafter referred to as resin component (A).

The addition-polymerizable compound (A1), an essential ingredient of the resin component (A), reacts with radicals generated by the photopolymerization initiator upon exposure to ultraviolet light, undergoes polymerization, crosslinking, and curing, and gives strength and hardness to the film after exposure. When coexisting with the alkali-soluble resin (A2), the compound (A1) becomes involved in alkali insolubilization of the exposed portion.

The addition-polymerizable compound (A1) may be any of those compounds which boil at 100° C. or higher at normal pressure and contain at least 2 ethylenically unsaturated groups in the molecule and such compounds include esters resulting from the reaction of polyhydric alcohols with α, β-unsaturated carboxylic acids such as diethylene glycol di(meth)acrylate [(meth)acrylate means acrylate or methacrylate hereinafter], triethylene glycol di(meth) acrylate, tetraethylene glycol di(meth)acrylate, trimethylolpropane di(meth)acrylate, trimethylolpropane tri(meth) acrylate, 1,3-propanediol (meth)acrylate, 1,3-butanediol (meth)acrylate, pentaerythritol tetra(meth)acrylate, dipentaerythritol hexa(meth)acrylate, 2,2-bis(4-acryloyloxydiethoxyphenyl)propane, 2,2-bis(4-methacryloyloxypentaethoxyphenyl)propane, and a mixture of 2,2-bis(4-methacryloyloxypolyethoxyphenyl)propanes (BEP-500, tradename of Shin-Nakamura Chemical Co., Ltd.), compounds obtained by the addition of glycidyl group-containing compounds with α, β-unsaturated carboxylic acids such as trimethylolpropane triglycidyl ether tri(meth)acrylate, bisphenol A diglycidyl ether di(meth) acrylate, and fluorenebisphenol diglycidyl ether di(meth) acrylate (ASF400, tradename of Nippon Steel Chemical Co., Ltd.), unsaturated amides such as methylenebisacrylamide and 1,6-hexamethylenebisacrylamide, and vinyl esters such as divinyl succinate, divinyl adipate, divinyl phthalate, divinyl terephthalate, and divinyl benzene -1,3-disulfonate.

The addition-polymerizable compound (A1) may be either a low-molecular-weight compound or a high-molecular-weight compound, but it is preferably a low-molecular-weight compound with a molecular weight of 1,000 or less from the standpoint of good solvent solubility and low viscosity.

Incorporation of the alkali-soluble resin (A2) as one of the resin components gives a resin composition of a good alkali development quality. Desirable as the alkali-soluble compound (A2) are those which contain acidic groups such as carboxylic and phenolic hydroxyl groups in the molecule and they may contain ethylenically unsaturated groups at terminal locations. Examples of the alkali-soluble resin (A2) are copolymers of (meth)acrylic acid and alkyl (meth) acrylate and copolymers of (meth)acrylic acid, alkyl (meth) acrylate and vinyl monomers copolymerizable with the foregoing two (meth)acrylic compounds. Alkyl (meth) acrylates here include butyl (meth)acrylate and 2-ethylhexyl (meth)acrylate. Vinyl monomers copolymerizable with (meth)acrylic acid and alkyl (meth)acrylate include tetrahydrofurfuryl (meth)acrylate, glycidyl (meth)acrylate, 2,2,2-trifluoroethyl (meth)acrylate, 2,2,3,3-tetrafluoropropyl (meth)acrylate, acrylamide, diacetone acrylamide, styrene, and vinyltoluene.

Additional examples of the alkali-soluble resin (A2) are ester oligomers containing carboxyl groups such as partial esters of styrene-maleic anhydride copolymers, partial esters of the copolymers of a diol and an acid dianhydride, and partial esters of unsaturated polyesters.

Recommended for use as the alkali-soluble resin (A2) is a compound which contains alkali-developable acidic functional groups such as carboxyl and phenolic hydroxyl groups and, moreover, occurs either as a solid with a molecular weight of 600 or more or a polymer with a number average molecular weight of 1,000 or more in order to render the film free from cracking and tackiness after application and drying of the resin composition.

Furthermore, a compound containing both two or more ethylenically unsaturated groups and alkali-solubilizing carboxyl groups in the molecule may be used as alkali-soluble resin (A2) together with the addition-polymerizable compound (A1). Such simultaneous use desirably provides a photopolymerizable composition with good resolution. The case in point is an addition product of an acid anhydride with a compound containing a hydroxyl group and two or more ethylenically unsaturated groups. For example, addition products of an acid with bisphenol epoxy (meth)acrylate described in Japan Kokai Tokkyo Koho Hei 6-1938 (1994) are desirable as such. In the cases where the film shows no cracking after drying and the tackiness presents no problem, for example, when exposure is effected in proximity mode while avoiding exposure in contact mode, the alkali-soluble resin (A2) is not necessarily a resin and may be a compound capable of polymerizing into resin.

In case the addition-polymerizable compound (A1) and the alkali-soluble resin (A2) are used together, the ratio (A1)/(A2) by weight is 10/90–90/10, preferably 20/80–80/20. Where the proportion of the alkali-soluble resin (A2) is lower than what this ratio stipulates, the photocured product becomes brittle and the solubility in an alkaline developer decreases because of a low acid value of the unexposed portion of the resin composition. On the other hand, where the proportion of the alkali-soluble resin (A2) is higher, the addition-polymerizable compound (A1) does not function sufficiently to form a crosslinked structure and bring about alkali insolubilization in the exposed portion and, besides, the acid value increases to such an extent as to cause an increase in the solubility in an alkaline developer not only in the unexposed portion but also in the exposed portion.

In addition to the aforementioned (A1) and (A2), it is allowable to add, as other ingredients of the resin component (A), reactive diluents that are miscible with (A1) and (A2) and contain only one ethylenically unsaturated group in the molecule or resin ingredients that are neither photopolymerizable nor alkali-soluble, for example, epoxy resins, rosin resins, and alkyd resins, in proportions less than 50% by weight of the resin component (A) as a whole. When the addition is 50% by weight or more, the extra components cause such defects as decrease in solubility due to a drop of the acid value in the unexposed portion and loss of patterns during development due to a drop of crosslinking density in the exposed portion.

The photopolymerization initiator (B) to be used in photopolymerizable compositions of this invention generates radicals upon exposure to light, particularly to UV, and initiates the polymerization of the addition-polymerizable compound (A1). The photopolymerization initiator (B) to be used in photopolymerizable resin compositions of this invention comprises (B1) and (B2) as essential ingredients and additionally at least one kind of compound selected from (B3), (B4), and (B5).

The photopolymerization initiator (B1) is a diaminobenzophenone compound represented by the aforementioned general formula (1). In the general formula (1), R is a hydrogen atom or an alkyl group with 1–3 carbon atoms and, although R may be identical with or different from one another, it is preferably methyl or ethyl group. Typical examples of (B1) are 4,4', -diethylaminobenzophenone and 4,4'-dimethylaminobenzophenone.

The photopolymerization initiator (B2) is an N-phenylglycine compound represented by the aforementioned general formula (2). In the general formula (2), R is an alkyl group with 1–8 carbon atoms, R' is a hydrogen atom or an alkyl group with 1–8 carbon atoms, n is an integer in the range 0–5, and R may be identical with or different from one another when n is 2 or more. Preferably, R is methyl or ethyl group, R' is a hydrogen atom or an alkyl group with 1–4 carbon atoms and n is 0 or 1. Examples of (B2) are N-phenylglycine, N-phenylglycine ethyl ester, N-phenylglycine methyl ester, N-phenylglycine butyl ester, and N-phenylglycine propyl ester.

The photopolymerization initiator (B3) is a 3,3',4,4'-tetra (alkylperoxycarbonyl)benzophenone represented by the aforementioned general formula (3). In the general formula (3), R is an alkyl group with 1–8 carbon atoms and is either identical with or different from one another. Preferably, R is a branched alkyl group. A typical example of (B3) is 3,3',4,4'-tetra(t-butylperoxycarbonyl)benzophenone.

The photopolymerization initiator (B4) is 2-methyl-1-[4-(methylthio)phenyl]-2-morpholinopropan-1-one. This compound is available, for example, as Irgacure 907 (tradename of Ciba Speciality Chemical).

The photopolymerization initiator (B5) is a 1,3,5-triazine derivative containing at least one trihalomethyl group as substituent. The 1,3,5-triazine derivative (B5) needs to be 1,3,5-triazine substituted with at least one trihalomethyl group on a carbon atom in the ring. The other two carbon atoms in the ring may or may not contain a substituent; when a substituent is present, it may be a trihalomethyl group, an alkyl group with 1–18 carbon atoms, a substituted alkyl group, an alkylene group, a substituted alkylene group, an aryl group, or a substituted aryl group. The halogen in a trihalomethyl group may be chlorine or bromine. Examples of (B5) are 2,4,6-tris(trichloromethyl)-1,3,5-triazine, 2-methyl-4,6-bis(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, and 2-(4-methylthiostyryl)-4,6-bis(trichloromethyl)-1,3,5-triazine.

These photopolymerization initiators are incorporated into 100 parts by weight of the resin component (A) as follows: diaminobenzophenone compound-(B1), 0.05–2.0 parts by weight, preferably 0.08–1.0 part by weight; N-phenylglycine compound (B2), 0.2–2 parts by weight, preferably 0.3–1.5 parts by weight; 3,3',4,4'-tetra (alkylperoxycarbonyl)benzophenone (B3), 0–2.5 parts by weight, preferably 0.1–2.5 parts by weight, more preferably 0.5–2.0 parts by weight; 2-methyl-1-[4-(methylthio)

phenyl]-2-morpholinopropan-1-one (B4), 0–5 parts by weight, preferably 1–5 parts by weight, more preferably 2–4 parts by weight; and 1,3,5-triazine derivative (B5), 0–1 part by weight, preferably 0 or 0.1–0.7 part by weight, more preferably 0 or 0.2–0.5 part by weight. The proportion of diaminobenzophenone compound (B1) is preferably controlled at 0.05–1 part by weight when the film thickness is 10 μm or more and at 0.5–2 parts by weight when the film thickness is less than 10 μm while that of 1,3,5-triazine derivative (B5) is controlled at 0–0.5 part by weight when the film thickness is 30 μm or more or the composition is for blue ink.

A further advantage can be gained by incorporating the photopolymerization initiators into 100 parts by weight of the resin component (A) in the following proportions: diaminobenzophenone compound (B1), 0.05–2.0 parts by weight; N-phenylglycine compound (B2), 0.2–2 parts by weight; 3,3',4,4'-tetra(alkylperoxycarbonyl)benzophenone (B3), 0.1–2.5 parts by weight; 2-methyl-1-[4-(methylthio) phenyl]-2-morpholinopropan-1-one (B4), 1–5 parts by weight, and 1,3,5-triazine derivative (B5), 0–0.5 part by weight.

In the cases where the resin component (A) is mainly composed of the addition-polymerizable compound (A1) and the alkali-soluble resin (A2), that is, where (A1) and (A2) account for the greater part of (A), the expression "100 parts by weight of the resin component (A)" can be replaced by "100 parts by weight of the sum of (A1) and (A2)."

It is recommended to incorporate the photopolymerization initiators into 100 parts by weight of the sum of (A1) and (A2) in the following proportions: diaminobenzophenone compound (B1), 0.05–2.0 parts by weight, preferably 0.08–1.0 part by weight; N-phenylglycine compound (B2), 0.2–2 parts by weight, preferably 0.3–1.5 parts by weight; 3,3',4,4'-tetra(alkylperoxycarbonyl)benzophenone (B3), 0–2.5 parts by weight, preferably 0.1–2.5 parts by weight, more preferably 0.5–2.0 parts by weight; 2-methyl-1-[4-(methylthio)phenyl]-2-morpholinopropan-1-one (B4), 0–5 parts by weight, preferably 1–5 parts by weight, more preferably 2–4 parts by weight; and 1,3,5-triazine derivative (B5), 0–1 part by weight, preferably 0 or 0.1–0.7 part by weight, more preferably 0 or 0.2–0.5 part by weight.

When the proportion of diaminobenzophenone compound (B1) is short of the aforementioned range, the generation of radicals is insufficient and the surface curing becomes incomplete due to inhibition by oxygen and satisfactory properties are not obtained. Conversely, an excess proportion of (B1) causes the absorption of light to occur on the surface alone during exposure and photocuring of the inside becomes insufficient. As for the proportion of N-phenylglycine compound (B2), a shortage does not enhance the photosensitivity sufficiently while an excess lowers the storage stability of photopolymerizable resin compositions.

In the co-presence of (B1) and (B2), 3,3',4,4'-tetra (alkylperoxycarbonyl)benzophenone (B3), 2-methyl-1-[4-(methylthio)phenyl]-2-morpholinopropan-1-one (B4), and 1,3,5-triazine derivative (B5) enhance the sensitivity and, in particular, promote the surface curing. In addition to enhancement of the sensitivity and promotion of the surface curing, (B3) is effective for enhancing the sensitivity, particularly not only to the i-line but also to the g-line and the h-line. The proportion of (B3), when in use, must be 0.1 part by weight or more per 100 parts by weight of the resin component (A) to enhance the sensitivity sufficiently. An excess of (B3), however, lowers the storage stability. When used in combination with the aforementioned (B1) and (B2), (B4) markedly enhances the photosensitivity. Sufficient enhancement is not obtained unless (B4) is used in a proportion of 1 part by weight or more per 100 parts by weight of the resin component (A). Although 1,3,5-triazine derivative (B5) is effective for enhancing the sensitivity and promoting the surface curing, an excess of it causes insufficient curing inside the film or loss of patters and also hinders the transmission of blue light. Therefore, it is recommended to control the proportion of (B5) at 1 part by weight or less, preferably 0.5 part by weight or less, per 100 parts by weight of the resin component (A).

These photopolymerization initiators are used desirably in the following combinations:

① (B1)-(B2)-(B3)-(B4)-(B5)
② (B1)-(B2)-(B3)-(B4)
③ (B1)-(B2)-(B3)
④ (B1)-(B2)-(B4)

In particular, in the case of the preparation of blue inks where the transmission of the i-line needed for curing diminishes, it is advantageous to use the combination of ①, ② or ③ containing (B1), (B2), and (B3) which are capable of enhancing sensitivity even to the g-line to effect sufficient curing of the inside. The combination ①, ② or ③ which contains (B4) or (B5) is advantageous for raising the surface hardness. However, (B5) absorbs a part of blue light as mentioned above, and it needs to be used in a restricted amount. Therefore, an alternative is to use (B3) or (B4) as a whole or partial substitute for (B5).

In formulating photopolymerizable resin compositions of this invention, it is necessary to exercise special care in determining the amount of the photopolymerization initiator (B) to be incorporated into the resin component (A) because a shortage of (B) causes insufficient photocuring with the resultant thinning of the lines and roughening of the surface during development while an excess of (B) causes the majority of light to be absorbed in the upper portion of the film leaving the lower portion of the film uncured.

In the cases where a photopolymerizable resin composition of this invention is applied in a relatively thick layer and cured, special care must be given to the amount of photopolymerization initiator to be added. With addition of an excessive amount, the absorption of light occurs mostly in the upper portion with little light reaching the lower portion and the lower portion remains uncured. On the other hand, with addition of a too small amount, the curing occurs insufficiently and thinning of the lines and overdevelopment occur. One of the methods to determine the optimal composition of additives is to apply a photopolymerizable resin composition, expose the film of the applied composition to light, and choose such an amount of additives as to give a transmission of 5–80% at the main wavelength of the light in use. For example, in case the curing is effected by the i-line, it is desirable to add the photopolymerization initiators so that the transmission at 365 nm becomes 50–80% at a film thickness of 10 μm or exceeds 5% at a film thickness of 40 μm.

In formulating photopolymerizable resin compositions of this invention, it is allowable to use other known photopolymerization initiators whose maximum absorption wavelength lies in the region shorter than the i-line (365 nm) in addition to the aforementioned photopolymerization initiators (B1) to (B5). An example of photopolymerization initiators to be used for this purpose is benzophenone. However, if such a polymerization initiator is added in excess of the amount which reduces the transmission of the light for exposure at its main wavelenght to 5% or less, it would undesirably cause insufficient curing in the inside.

Therefore, the polymerization initiator in question is never used in excess of 3 parts by weight per 100 parts by weight of the resin component (A).

In addition to the resin components and photopolymerization initiators, colorants such as dyes and pigments may be incorporated into photopolymerizable resin compositions of this invention. A variety of colorants are useful for colorants, for example, titania, carbon black, iron oxide, quinacridone pigments, phthalocyanine pigments, azo pigments, and acid dyes. Preferable among them are blue dyes or pigments such as phthalocyanine blue.

Where the application involves the color filters for liquid crystal displays and liquid crystal projectors, organic pigments are used on account of their transparency and color purity. The following are desirable examples of such organic pigments: for blue, phthalocyanine pigments and indanthrene pigments, particularly ε-phthalocyanine blue (C.I. Pigment Blue 15:6); for red, anthraquinone pigments, quinacridone pigments, diketopyrrolopyrrole pigments, perylene pigments, and particularly diketopyrrolopyrrole red (C.I. Pigment Red 254) and dianthraquinonyl red (C.I. Pigment Red 177); for green, chlorinated phthalocyanine green (C.I. Pigment Green 7) and brominated phthalocyanine green (C.I. Pigment Green 36); for violet, Dioxazine Violet (C.I. Pigment Violet 23); for yellow, isoindoline yellow (C.I. Pigment Yellow 83) and Diarylide Yellow (C.I. Pigment Yellow 83). These pigments are micro-dispersed in an organic solvent to an average particle diameter of 0.2 μm or less in a sand mill together with those pigment derivatives and graft polymers which contribute to stabilize the microdispersion and then mixed with photopolymerizable resin compositions to give colored photopolymerizable resin compositions or inks of this invention.

Additives such as the following may also be incorporated into photopolymerizable resin compositions of this invention: surfactants for improving levelling during application and reducing uneven evaporation during drying, coupling agents for improving adhesion to the base plate, fillers for improving the crack resistance during the heat cycle test, and adhesion promoters for facilitating adhesion to fillers.

Moreover, in order to prepare photopolymerizable resin compositions of this invention as homogeneous solutions, solvents which are capable of dissolving the aforementioned components may be incorporated into the compositions. Such solvents include, for example, a variety of glycol ethers such as ethylene glycol monobutyl ether, ethylene glycol monohexyl ether, ethylene glycol monophenyl ether, propylene glycol monomethyl ether, propylene glycol monophenyl ether, diethylene glycol dimethyl ether, and triethylene glycol dimethyl ether, ketones such as acetone, methyl ethyl ketone, methyl isobutyl ketone, cyclohexanone, isophorone, pentoquinone, N-methylpyrrolidone, and γ-butyrolactone, ethers such as butyl ether, dioxane, and tetrahydrofuran, alcohols such as methoxybutanol, diacetone alcohol, butanol, and isopropanol, hydrocarbons such as toluene, xylene, and hexane, and esters such as ethyl acetate, butyl acetate, and ethyl benzoate.

Colorant-containing photopolymerizable resin compositions of this invention can be used as inks. In particular, those containing blue colorants give excellent blue inks. In applications of the conventional blue inks composed of photopolymerizable resin composition containing blue colorants, the blue colorants often hinder the photocuring of the inks. With blue inks of this invention, the photocuring proceeds into the depth because of high sensitivity to a relatively wide wavelength range of UV.

Photopolymerizable resin compositions of this invention are available in two kinds, one composed of the resin component (A) and the photopolymerization initiator (B) only and the other composed of (A), (B) and other additives and solvents, and they are used differentially depending upon the end use. For example, compositions in solution and inks are used in insulating films for semiconductors, resist materials for semiconductors, liquid crystal displays, color filter materials for CCD cameras, colored films, touch panels, and insulating spacers for displays and they are also used as pattern-forming materials and image-forming materials.

Regarding the method of use, the one in general practice is to apply a photopolymerizable resin composition prepared as solution to the base to a given thickness, dry, and expose to active light (UV) of a given wavelength range to effect photocuring, although not restricted to this particular one. The thickness of the applied composition is 0.2–100 μm, preferably 1–3 μm, under a dry condition. The source of active light is preferably the one which emits mainly the i-, g-, and h-lines. As for development, it is preferable to dissolve and remove the unexposed portion by alkali development with the use of an aqueous solution of alkali. There may be a case, as needed, where the whole surface is exposed and the development is omitted.

The application of a photopolymerizable resin composition of this invention as color filter is described as an example. A photopolymerizable resin composition of this invention, preferably containing a suitable solvent and additives, is made into a homogeneous solution or an ink. The solution or ink is applied to the base plate of a color filter to a given thickness by such means as spin coating, bar coating, spray coating, or printing coating and dried to form a film with a thickness of 0.2–100 μm. The film is exposed through a photomask to a light source such as super high-pressure mercury lamp, high-pressure mercury lamp, metal halide lamp, far ultraviolet lamp, and visible light laser and cured. The exposed film is then developed by dissolving the uncured portion in a stream or shower of an aqueous solution of alkali or an organic solvent, typical alkali being an alkali metal carbonate such as lithium carbonate, an alkali metal hydroxide such as sodium hydroxide, and an organic base such as tetramethylammonium hydroxide, and washing with water. In the case of an ink, the procedure is repeated for each color. A photopolymerizable resin composition containing no colorant is used as a protective film for color filter and it is applied to the base plate for color filter on which the ink has been developed, and then similarly dried, exposed, and developed.

PREFERRED EMBODIMENTS OF THE INVENTION

Examples 1–3

Figure 1:
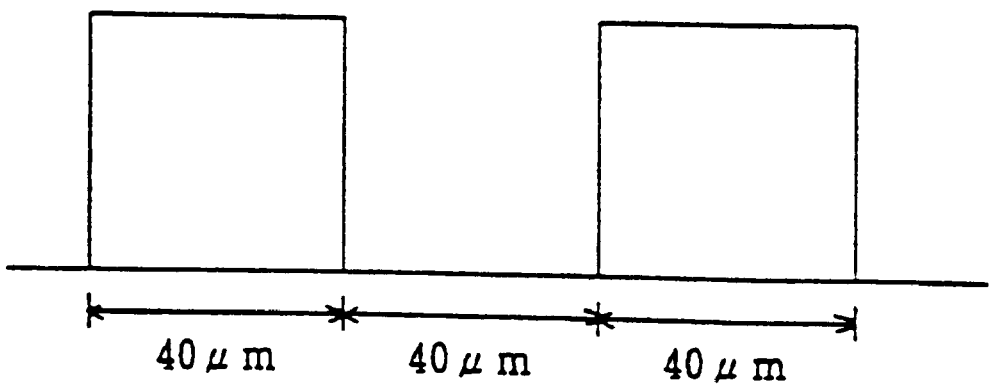
FIG. 1 illustrates the cross section of the film with a thickness of 40 μm formed with the use of the photopolymerizable resin composition of Example 2.

Thirty (30) parts by weight of dipentaerythritol hexaacrylate (DPHA) was used as (A1) and 124 parts by weight of a 56.5 wt % propylene glycol monomethyl ether acetate solution (70 parts by weight as solid) of fluorenebisphenol type epoxy acrylate/acid anhydride addition polymer (V259ME, tradename of Nippon Steel Chemical Co., Ltd.) was used as (A2).

To 100 parts by weight of the sum of (A1) and (A2) were added 15 parts by weight of epoxy resin (XY4000H, tradename of Yuka Shell Epoxy K.K.) for providing alkali resistance after heat treatment, 1.2 parts by weight of a silane coupling agent (S510, tradename of Chisso Corporation) for providing adhesion to the base plate, and 61 parts by weight of propylene glycol methyl ether acetate as solvent.

Then, to 100 parts by weight of the sum of (A1) and (A2) were added 2-methyl-1-[4-(methylthio)phenyl]-2-morpholinopropan-1-one (Irgacure 907, tradename of Ciba) as photopolymerization initiator (B4), 4,4'-diethylaminobenzophenone (EABF, tradename of Hodogaya Chemical Co., Ltd.) as (B1), and N-phenylglycine as (B2) in the amounts shown in Table 1 to prepare a photopolymerizable resin composition as a homogeneous solution.

The photopolymerizable resin composition thus prepared was applied by a spin coater to a glass base plate to a thickness of 10 $\mu$m or 40 $\mu$m after drying and prebaked at 80° C. for 5 minutes when the film thickness was 10 $\mu$m or at 100° C. for 15 minutes when the film thickness was 40 $\mu$m to form a film for interlayer insulating film on the glass base plate.

The film thus formed was exposed through a negative mask to UV (illuminance 1 lmw/cm$^2$, i-line as standard) in a light exposure apparatus (HTE505S, tradename of HI-TECK. Co., Ltd.), developed by a 0.7 wt % aqueous solution of diethanolamine (28° C.) when the film thickness was 10 $\mu$m or by a 1.4 wt % aqueous solution of diethanolamine when the film thickness was 40 $\mu$m and tested for the sensitivity by the following procedure.

With the aid of a wedge filter for sensitivity measurement (available from Matsuzaki Shinku K.K.), the specimen was exposed to ultraviolet light at 200 mJ/cm$^2$ with i-line as standard in the aforementioned light exposure apparatus and then developed by a diethanolamine developer, in the same manner as above, for 60 seconds when the film thickness was 10 $\mu$m or for 90 seconds when the film thickness was 40 $\mu$m. The sensitivity was determined as the minimum light exposure to give a residual film after development. This means the smaller the minimum light exposrue, the higher the sensitivity. The results are shown in Table 1.

Comparative Examples 1–4

The experiment was carried out as in Example 1 except using the kind and amount of photopolymerization initiator shown in Table 1. The results are shown in Table 1. The term overdevelopment in Table 1 means the complete absence of a residual film after development.

TABLE 1

| | Photopolymerization initiator (part by weight) | | | | Sensitivity (mj/cm$^2$) | |
|---|---|---|---|---|---|---|
| | | | | | Film thickness 10 $\mu$m | Film thickness 40 $\mu$m |
| | Irgacure 907 | Benzophenone | EABF | N-Phenylglycine | | |
| Example 1 | 3.0 | 0 | 0.1 | 0.4 | 90 | 85 |
| Example 2 | 3.0 | 0 | 0.1 | 1.0 | 85 | 65 |
| Example 3 | 3.0 | 0 | 0.1 | 3.2 | — | 200 |
| Comparative example 1 | 3.0 | 0 | 0.1 | 0 | 108 | 105 |

TABLE 1-continued

| | Photopolymerization initiator (part by weight) | | | | Sensitivity (mj/cm$^2$) | |
|---|---|---|---|---|---|---|
| | | | | | Film thickness 10 $\mu$m | Film thickness 40 $\mu$m |
| | Irgacure 907 | Benzophenone | EABF | N-Phenylglycine | | |
| Comparative example 2 | 0 | 0 | 0.1 | 3.0 | 190 | Overdevelopment |
| Comparative example 3 | 0 | 1.52 | 0.1 | 0.5 | Overdevelopment | Overdevelopment |
| Comparative example 4 | 0 | 1.52 | 0.1 | 2.0 | 100 | — |

It is apparent from the aforementioned results that the photopolymerizable resin compositions of Examples 1 and 2 containing all three photopolymerization initiators (B1), (B2), and (B4) display higher sensitivity than those of Comparative Examples 1 and 2 containing two photoinitiators out of the three and those of Comparative Examples 3 and 4 containing benzophenone in place of (B4). There exists an optimal value for the amount of (B2) regarding the sensitivity and the sensitivity decreases as the addition increases.

The 10 $\mu$m-thick films formed from the photopolymerizable resin compositions of Example 2 and Comparative Examples 1 and 3 were tested by an exposure spectrometer (SS25CP, tradename of Nihon Bunko K.K.) for the relationship between the wavelength of light for exposure and the sensitivity (curing rate). Concretely, the specimen was exposed to light of a given wavelength range in steps by changing the exposure time and position, developed by a 0.7 wt % aqueous solution of diethanolamine at 28° C. for 40 seconds, and then examined for the number of steps of the residual film on the base plate for each wavelength and exposure time. In this case, the greater the number of steps, the higher the sensitivity. The results are shown in Table 2.

TABLE 2

| | | Wavelength (nm) | | | |
|---|---|---|---|---|---|
| | | 33 | 365 | 405 | 437 |
| Number of steps | Example 2 | 5 | 6 | 0 | 0 |
| | Comparative example 1 | 4 | 4 | 0 | 0 |
| | Comparative example 3 | 0 | 0 | 0 | 0 |

It is seen from the results shown in Table 2 that the addition of (B 1), (B2), and (B4) enhances the sensitivity in the wavelength range 300–400 nm, but curing does not occur in the same wavelength range when benzophenone is substituted for (B4).

Next, the 10 $\mu$m-thick films formed from the photopolymerizable resin compositions of Example 2 and Comparative Example 1 were tested for resolution. The specimen was exposed to light at 200 mJ/cm$^2$ through a line and space mask for resolution measurement (available from Nihon Firukon K.K.) and developed by a 0.7 wt % aqueous solution of diethanolamine at 28° C. for 40 seconds. The exposed portion remained as lines on the plate without any loss and the unexposed portion came off to form a space between lines after development and, when this happened, the minimum width of the line was taken as resolution. The results are shown in Table 3, in which the numerator designates the width of line and the denominator the width of space, both in µm.

TABLE 3

|  | Development time (seconds) | | | | | |
| --- | --- | --- | --- | --- | --- | --- |
|  | 40 | 60 | 90 | 120 | 150 | 180 |
| Example 2 | 20/20 | 20/20 | 30/30 | 30/30 | 60/60 | 60/60 |
| Comparative example 1 | 20/20 | 30/30 | 40/40 | 60/60 | 80/80 | 100/100 |

Table 3 indicates that the specimen of Example 2 is superior to that of Comparative Example 1 in adhesion of patterns even after a long development time. This means that the addition of N-phenylglycine promotes the curing in the inside and causes the patterns to adhere to the base plate without dissolving during a long development time, that is, the addition provides a wide latitude in development for stable patterning.

Furthermore, the 40 µm-thick films formed from the photopolymerizable resin compositions of Example 2 and Comparative Example 1 were observed for the shape of a line and space pattern. The specimen was exposed to light at 200 mJ/cm$^2$ through the aforementioned line and space mask for resolution measurement and developed by a 1.4 wt % aqueous solution of diethanolamine at 28° C. for 100 seconds to give a pattern with a 40 µm-wide line and a 40 µm-wide space. The cross section of the pattern obtained from the photopolymerizable resin composition of Example 2 is shown in FIG. 1 and that of Comparative Example 1 in FIG. 2.

Figure 2:
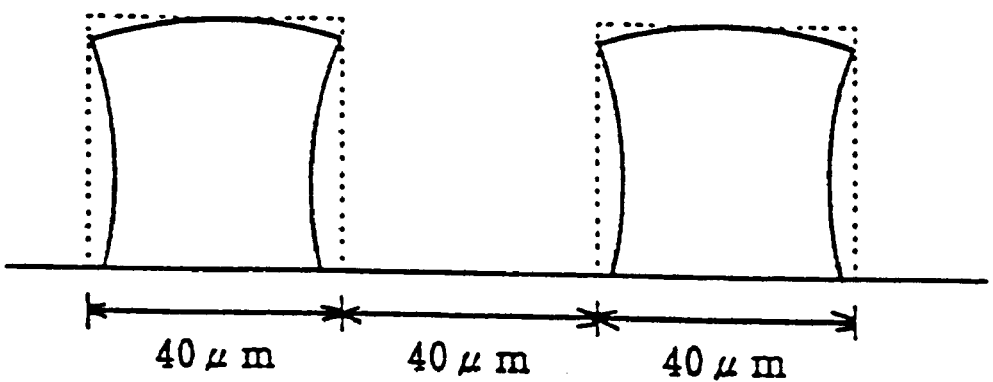
FIG. 2 illustrates the cross section of the film with a thickness of 40 μm formed with the use of the photopolymerizable resin composition of Comparative Example 1.

As is apparent from a comparison of FIGS. 1 and 2, the photopolymerizable resin composition of Example 2 cures well in the inside and maintains the lines in good shape while that of Comparative Example 1 give lines which show thinning and are curved on the side.

Examples 4–5 and Comparative Examples 5–6

The resin component (A) was prepared from 25 parts by weight each of dipentaerythritol hexaacrylate (DPHA, tradename of Nippon Kayaku Co., Ltd.) and pentaerythritol acrylate (PET-30, tradename of Kyoeisha Chemical Co., Ltd.) as (A1) and 50 parts by weight of isobornyl methacrylate-methacrylic acid-epoxycyclohexylmethyl methacrylate copolymer (molar ratio 28/36/36) (Cyclomer M100, tradename of Daicel Chemical Industries, Ltd.) as (A2).

To 100 parts by weight of the sum of (A1) and (A2) were added the following compounds respectively in the amounts shown in Table 4 to give 4 kinds of colored photopolymerizable resin compositions in homogeneous solution; Ceroxide 2021P (tradename of Daicel Chemical Industries, Ltd.) for providing heat resistance during heat treatment, a silane coupling agent (S510, tradename of Chisso Corporation) for improving the adhesion to the base plate, a phthalocyanine blue dispersion in a 3:2 mixture by weight of diglyme and propylene glycol monomethyl ether acetate (PGMEA) as blue pigment, and photopolymerization initiator (B) made up of 2-methyl-1-[4-(methylthio)phenyl]-2-morpholinopropan-1-one (Irgacure 907, tradename of Ciba) as (B4), 4,4'-diethylaminobenzophenone (EABF, tradename of Hodogaya Chemical Co., Ltd.) as (B1), and N-phenylglycine as (B2), and a known photopolymerization initiator bis(2,4,6-trimethylbenzoyl)phenylphosphine oxide (CGI-819, tradename of Ciba) or 2-(4-methoxystyryl)-4,6-bis(trichloromethyl)-1,3,5-triazine (TAZ-110, tradename of Midori Kagaku K.K.).

TABLE 4

|  | Amount added (part by weight) | | | |
| --- | --- | --- | --- | --- |
|  | Example 4 | Example 5 | Comparative example 5 | Comparative example 6 |
| 2021P | 5.5 | 5.5 | 5.5 | 5.5 |
| S510 | 1.5 | 1.5 | 1.5 | 1.5 |
| Phthalocyanine blue | 28 | 28 | 28 | 28 |
| Diglyme | 240 | 240 | 240 | 240 |
| PGMEA | 160 | 160 | 160 | 160 |
| Irgacure 907 | 2.5 | 2.5 | 2.5 | 2.5 |
| EABF | 0.42 | 2.0 | 0.42 | 0.42 |
| CGI-819 | 2.5 | 2.5 | 2.5 | 0 |
| N-Phenylglycine | 0.83 | 1.5 | 0 | 0 |
| TAZ-110 | 0 | 0 | 0 | 2.5 |

Each of the photopolymerizable resin compositions thus obtained was applied to a glass base plate by a spin coater to a film thickness after drying of 1.5 µm and dried at 60° C. for 5 minutes to form a film for color filter and the film was tested for the sensitivity and chromaticity under the following conditions. The results are shown in Table 5.

[Determination of Sensitivity]

With the use of a wedge filter for sensitivity measurement, the specimen was exposed to ultraviolet light with i-line as standard at 100 mJ/cm$^2$ and then developed by 0.01N aqueous potassium hydroxide at 25° C. for 30 seconds as described above and the minimum exposure giving a residual film after development was taken as sensitivity.

[Determination of Chromaticity]

The aforementioned film for color filter on the glass base plate was exposed to ultraviolet light with i-line as standard at 300 mJ/cm$^2$ and developed by 0.01N aqueous potassium hydroxide at 25° C. for 30 seconds to give a blue pattern, which was postbaked at 200° C. for 30 minutes and tested for the chromaticity with the aid of a color analyzer (TC-1800MK2, tradename of Tokyo Denshoku K.K.).

TABLE 5

|  | Example 4 | Example 5 | Comparative example 5 | Comparative example 6 |
| --- | --- | --- | --- | --- |
| Sensitivity (mj/cm$^2$) | 50 | 35 | 65 | 35 |
| Hue x | 0.145 | 0.145 | 0.145 | 0.145 |
| Hue y | 0.155 | 0.155 | 0.155 | 0.155 |
| Lightness Y | 21 | 20.6 | 21 | 19.5 |

The results in Table 5 indicate that the specimen of Example 4 is more sensitive than that of Comparative Example 5. Moreover, the blue filter of Example 5 shows higher lightness (Y) than that of Comparative Example 6 at the same hue (x, y) and the effect for enhancing the sensitivity was produced without greatly influencing the color characteristics and thus the polymerizable resin compositions tested were confirmed to be highly transparent and show good reproducibility of the pigment color.

Examples 6–11 and Comparative Examples 7–9

The resin component (A) was prepared from 50 parts by weight of a mixture of dipentaerythritol hexaacrylate and dipentaerythritol pentaacrylate (KAYARAD-DPHA, tradename of Nippon Kayaku Co., Ltd.) as (A1) and 88.5 parts by weight of a 56.5% propylene glycol monomethyl ether acetate solution (50 parts by weight as solid) of fluorenebisphenol type epoxy acrylate-acid anhydride addition alternating copolymer (V-301M, tradename of Nippon Steel Chemical Co., Ltd.) as (A2).

To 100 parts by weight of the sum of (A1) and (A2) as solid were added 15.7 parts by weight of YX4000H (tetramethylbiphenyl type epoxy resin available from Yuka Shell Epoxy K.K.) as thermal crosslinking agent, the photopolymrization initiators shown in Tables 6 and 7, 0.23 part by weight of surfactant FC430 (available from Sumitomo 3M Ltd.), and 540 parts by weight of propylene glycol monomethyl ether acetate as solvent to give a homogeneous solution. The solution was then mixed homogeneously with 318 parts by weight of a phthalocyanine blue (PB15:6) dispersion (available from Mikuni Color Works Ltd., content of pigment 20%, with propylene glycol monomethyl ether acetate used as dispersion medium). In this manner, 9 kinds of colored photopolymerizable resin compositions, that is, blue inks, were prepared in which the weight ratio of pigment to resin was 0.55.

Each of the colored photopolymerizable resin compositions was applied by a spin coater to a glass base plate to a film thickness after drying of 1.1 μm and dried at 80° C. for 5 minutes to form a film for color filter on the glass base plate. The film was further treated as in Example 4 and tested for the sensitivity and chromaticity, except carrying out the development by a 0.4% aqueous solution of sodium carbonate at 25° C. for 40 seconds. In addition, spectral exposure was conducted on the films as in Example 2 to determine the sensitivity at each wavelength. The results of Examples 6–10 are shown in Table 6 and those of Example 11 and Comparative Examples 7–9 in Table 7. The photopolymerization initiators listed in Tables 6 and 7 are designated in the same manner as in Example 4 and Table 4 and those newly appearing here are tetra(t-butylperoxycarbonyl) benzophenone (BTTB available from NOF Corp., 25% toluene solution, the numerical value given in Tables 6 and 7 designating solid in part by weight) and Triazine PP (available from Nihon Siber Hegner K.K.).

TABLE 6

| | Amount added (part by weight) | | | | |
|---|---|---|---|---|---|
| | Example 6 | Example 7 | Example 8 | Example 9 | Example 10 |
| Triazine PP | 0 | 0 | 0.5 | 0.5 | 0 |
| Irgacure 907 | 3 | 3 | 3 | 0 | 0 |
| EABF | 2 | 2 | 2 | 2 | 2 |
| CGI-819 | 2.5 | 0 | 0 | 0 | 2.5 |
| N-Phenylglycine | 2 | 1.5 | 1.5 | 1.5 | 2 |
| BTTB | 1 | 1 | 1 | 1 | 1 |
| Sensitivity (mj/cm$^2$) | 35 | 53 | 35 | 75 | 80 |
| Chromaticity | | | | | |
| Hue x | 0.141 | 0.141 | 0.141 | 0.141 | 0.141 |
| Hue y | 0.154 | 0.154 | 0.154 | 0.154 | 0.154 |
| Lightness Y | 21.1 | 21.1 | 21 | 20.9 | 21.1 |
| Number of steps Wavelength (nm) | | | | | |
| 365 | 6 | 6 | 6 | 6 | 6 |
| 405 | 7 | 7 | 7 | 7 | 7 |
| 437 | 4 | 4 | 4 | 4 | 4 |

TABLE 7

| | Amount added (part by weight) | | | |
|---|---|---|---|---|
| | Comparative example 7 | Comparative example 8 | Example 11 | Comparative example 9 |
| Triazine PP | 0 | 0 | 0 | 3 |
| Irgacure 907 | 3 | 3 | 0 | 3 |
| EABF | 0 | 2 | 2 | 1 |
| CGI-819 | 2.5 | 2.5 | 0 | 0 |
| N-Phenylglycine | 2 | 0 | 2 | 0 |
| BTTB | 1 | 1 | 1 | 0 |
| Sensitivity (mj/cm$^2$) | Flatting out in development | Flatting out in development | 100 Roughening of surface | 35 |
| Chromaticity | | | | |
| Hue x | — | — | 0.141 | 0.14 |
| Hue y | — | — | 0.154 | 0.154 |
| Lightness Y | — | — | 20.8 | 19.4 |
| Number of steps Wavelength (nm) | | | | |
| 365 | 6 | 6 | 6 | 6 |
| 405 | 2 | 7 | 7 | 7 |
| 437 | 0 | 0 | 4 | 4 |

In Examples 6 to 10, the copresence of three photopolymerization initiators (B1), (B2), and (B3), namely, diethylaminobenzophenone, N-phenylglycine, and BTTB with 0.5% or less of an i-line-sensitive photoinitiator or a triazine-based photoinitiator helped to give blue inks of high sensitivity, which in turn gave color filters of excellent lightness. On the other hand, in Comparative Example 9, the use of none of (B2) and a relatively large amount of Triazine PP resulted in an ink of high sensitivity, yet a blue filter of inferior lightness. In Comparative Examples 7 and 8, the absence of diethylaminobenzophenone (B1) or N-phenylglycine (B2) resulted in reduced sensitivity and led to flatting out during development. A comparison of spectral exposure in the examples and comparative examples suggests that the sensitivity is enhanced in the copresence of diethylaminobenzophenone, N-phenylglycine, and BTTB as curing occurs even at the g-line (437 nm) in their copresence. Moreover, the results of Example 11 suggest that the addition of a curing agent sensitive to the i-line is desirable for effecting surface curing.

INDUSTRIAL APPLICABILITY

Polymerizable resin compositions of this invention excel in resolution, adhesion of patterns, development latitude, and curing on the surface and inside, exhibit high sensitivity to ultraviolet light in the wavelength range 300–450 nm, and are transparent with good color reproducibility when mixed with colorants. The compositions cure satisfactorily even when the film thickness during light exposure is 10 μm or more. As the base of colored photopolymerizable resin compositions, the photopolymerizable resin compositions are highly transparent and give good color reproducibility without significantly influencing the color characteristics.

On account of these properties, polymerizable resin compositions of this invention can be used advantageously in insulating films, insulating films for semiconductors, protective films for color filters, inks for color filters, colored films, resist materials, resists for semiconductors, and insulating spacers for touch panels and also incorporated into liquid crystal color displays, liquid crystal color television, and color image sensors.

What is claimed is:

1. A photopolymerizable resin composition containing component (A) composed of a resin and/or a resin-forming ingredient and a photopolymerization initiator (B) wherein the component (A) comprises an addition polymerizable compound (A1) showing a boiling point of 100° C. or higher at normal pressure and having at least 2 ethylenically unsaturated groups in the molecule and the photopolymerization initiator (B) comprises a diaminobenzophenone compound (B1) represented by the following general formula (1)

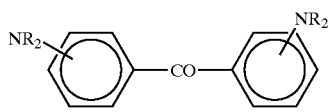

(1)

in which R is a hydrogen atom or an alkyl group with 1–3 carbon atoms and R's are identical with or different from each other, an N-phenylglycine compound (B2) represented by the following general formula (2)

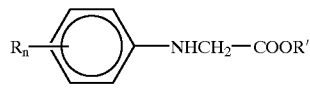

(2)

in which R is an alkyl group with 1–8 carbon atoms, R' is a hydrogen atom or an alkyl group with 1–8 carbon atoms, n is an integer in the range 0–5, and R's are identical with or different from each other when n is 2 or more, and at least one kind of compound selected from a group of a 3,3',4,4'-tetra(alkylperoxycarbonyl)benzophenone (B3) represented by the following general formula (3)

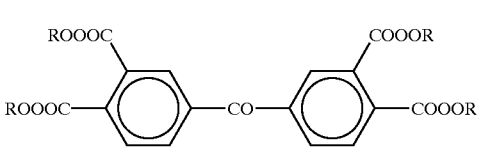

(3)

in which R is an alkyl group with 1–8 carbon atoms and R's are identical with or different from each other, 2-methyl-1-[4-(thiomethyl)phenyl]-2-morpholinopropan-1-one (B4), and a 1,3,5-triazine derivative (B5) containing at least one trihalomethyl group as substituent;

wherein said composition comprises 100 parts by weight of the component (A) composed of the resin and/or the resin-forming ingredient, 0.05–2.0 parts by weight of the diaminobenzophenone compound (B1), 0.2–2 parts by weight of the N-phenylglycine compound (B2), 0.1–2.5 parts by weight of the 3,3',4,4'-tetra(alkylperoxycarbonyl)benzophenone (B3), 0–5 parts by weight of the 2-methyl-1-[4-(thiomethyl)phenyl]-2-morpholinopropan-1-one (B4), and 0–1 part by weight of the 1,3,5-triazine derivative (B5).

2. A photopolymerizable resin composition as described in claim 1 wherein the component (A) composed of a resin and/or a resin-forming ingredient comprises the addition-polymerizable compound (A1) and an alkali-soluble resin (A2) and the ratio (A1)/(A2) by weight is 10/90–90/10.

3. A photopolymerizable resin composition as described in claim 1, wherein said composition comprises 100 parts by weight of the component (A) composed of the resin and/or the resin-forming ingredient, 0.05–2.0 parts by weight of the diaminobenzophenone compound (B1), 0.2–2 parts by weight of the N-phenylglycine compound (B2), 0.1–2.5 parts by weight of the 3,3',4,4'-tetra(alkylperoxycarbonyl)benzophenone (B3), 1–5 parts by weight of the 2-methyl-1-[4-(thiomethyl)phenyl]-2-morpholinopropan-1-one (B4), and 0–0.5 part by weight of the 1,3,5-triazine derivative (B5).

4. A photopolymerizable resin composition as described in claim 1, wherein the resin component (A) composed of the resin and/or the resin-forming ingredient comprises the addition-polymerizable compound (A1) and the alkali-soluble resin (A2) at the ratio (A1)/(A2) by weight in the range 10/90–90/10 and said composition comprises 100 parts by weight of the sum of (A1) and (A2), 0.05–2.0 parts by weight of the diaminobenzophenone compound (B1), 0.2–2 parts by weight of the N-phenylglycine compound (B2), 0.1–2.5 parts by weight of the 3,3',4,4'-tetra(alkylperoxycarbonyl)benzophenone (B3), 1–5 parts by weight of the 2-methyl-1-[4-(thiomethyl)phenyl]-2-morpholinopropan-1-one (B4), and 0–0.5 part by weight of the 1,3,5-triazine derivative (B5).

5. A film obtained by applying the photopolymerizable resin composition described in claim 1 followed by curing.

6. A photopolymerizable resin composition containing component (A) composed of a resin and/or a resin-forming ingredient and a photopolymerization initiator (B) wherein the component (A) comprises an addition polymerizable compound (A1) showing a boiling point of 100° C. or higher at normal pressure and having at least 2 ethylenically unsaturated groups in the molecule and the photopolymerization initiator (B) comprises a diaminobenzophenone compound (B1) represented by the following general formula (1)

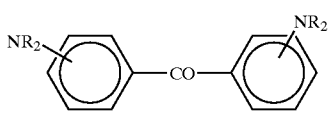

(1)

in which R is a hydrogen atom or an alkyl group with 1–3 carbon atoms and R's are identical with or different from each other, an N-phenylglycine compound (B2) represented by the following general formula (2)

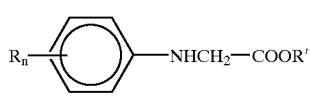

(2)

in which R is an alkyl group with 1–8 carbon atoms, R' is a hydrogen atom or an alkyl group with 1–8 carbon atoms, n is an integer in the range 0–5, and R's are identical with or different from each other when n is 2 or more, and at least one kind of compound selected from a group of a 3,3',4,4'-tetra(alkylperoxycarbonyl)benzophenone (B3) represented by the following general formula (3)

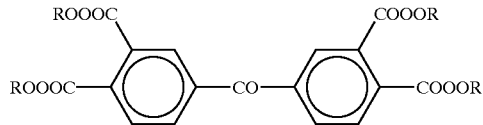

(3)

in which R is an alkyl group with 1–8 carbon atoms and R's are identical with or different from each other, 2-methyl-1-[4-(thiomethyl)phenyl]-2-morpholinopropan-1-one (B4), and a 1,3,5-triazine derivative (B5) containing at least one trihalomethyl group as substituent, wherein a blue colorant is incorporated.

7. A blue ink comprising the photopolymerizable resin composition described in claim 6.

8. A film obtained by applying the blue ink described in claim 7 followed by curing.

9. A color filter comprising the film described in claim 5 or 8.

* * * * *